(12) United States Patent
Lee et al.

(10) Patent No.: US 12,677,546 B2
(45) Date of Patent: Jul. 7, 2026

(54) ORGANIC LIGHT EMITTING DISPLAY DEVICE

(71) Applicant: LG Display Co., Ltd., Seoul (KR)

(72) Inventors: Jinuk Lee, Seoul (KR); ChangEun Kim, Seoul (KR); Joong Ha Lee, Paju-si (KR); Da Young Kim, Paju-si (KR); Won Gyu Jeong, Paju-si (KR); Myungeun Song, Seoul (KR)

(73) Assignee: LG Display Co., Ltd., Seoul (KR)

( * ) Notice: Subject to any disclaimer, the term of this patent is extended or adjusted under 35 U.S.C. 154(b) by 404 days.

(21) Appl. No.: 18/235,628

(22) Filed: Aug. 18, 2023

(65) Prior Publication Data

US 2024/0224749 A1     Jul. 4, 2024

(30) Foreign Application Priority Data

Dec. 30, 2022     (KR) ........................ 10-2022-0190499

(51) Int. Cl.
| | |
|---|---|
| *H10K 59/124* | (2023.01) |
| *H10K 59/122* | (2023.01) |
| *H10K 59/32* | (2023.01) |
| *H10K 59/38* | (2023.01) |
| *H10K 59/80* | (2023.01) |
| *H10K 102/00* | (2023.01) |

(52) U.S. Cl.
CPC ......... *H10K 59/124* (2023.02); *H10K 59/122* (2023.02); *H10K 59/32* (2023.02); *H10K 59/38* (2023.02); *H10K 59/8051* (2023.02); *H10K 2102/351* (2023.02)

(58) Field of Classification Search
CPC ......... H10K 50/805–818; H10K 59/38; H10K 59/8051–80518; H10K 2102/351
See application file for complete search history.

(56) References Cited

U.S. PATENT DOCUMENTS

| | | | | |
|---|---|---|---|---|
| 2016/0141538 A1* | 5/2016 | Lee | ........................ | H10K 50/11 |
| | | | | 257/40 |
| 2018/0011579 A1* | 1/2018 | Shin | .................... | G02F 1/13338 |
| 2022/0246877 A1* | 8/2022 | Yoon | ...................... | H10K 50/15 |

FOREIGN PATENT DOCUMENTS

| | | | | |
|---|---|---|---|---|
| CN | 104851988 A | * | 8/2015 | ....... H10K 59/80517 |
| KR | 10-2018-0076662 A | | 7/2018 | |
| KR | 10-2022-0051871 A | | 4/2022 | |

* cited by examiner

*Primary Examiner* — Mariceli Santiago
(74) *Attorney, Agent, or Firm* — PnK IP LLC

(57)     ABSTRACT

An organic light emitting display device includes a substrate on which a plurality of sub-pixels are defined, a thin film transistor disposed on the substrate, a passivation layer disposed to cover the thin film transistor, a color filter layer disposed on the passivation layer, a planarization layer disposed on the color filter layer, an anode disposed on the planarization layer to correspond to each of the plurality of sub-pixels, a bank defining an emission area by covering an edge of the anode, at least one light emitting layer disposed on the anode, and a cathode disposed on the light emitting layer, wherein the anode includes indium oxide ($In_xO_y$) and molybdenum oxide ($MoO_z$).

20 Claims, 5 Drawing Sheets

100

Wavelength (nm)

ORGANIC LIGHT EMITTING DISPLAY DEVICE

CROSS-REFERENCE TO RELATED APPLICATION

This application claims the priority of Korean Patent Application No. 10-2022-0190499 filed on Dec. 30, 2022, which is hereby incorporated by reference in its entirety.

BACKGROUND

Field of the Disclosure

The present disclosure relates to an organic light emitting display device, and more particularly, to an organic light emitting display device having improved luminance by improving light extraction efficiency.

Description of the Background

Recently, as our society advances toward an information-oriented society, the field of display devices for visually expressing an electrical information signal has rapidly advanced. Various display devices having excellent performance in terms of thinness, lightness, and low power consumption, are being developed correspondingly.

In particular, an organic light emitting display device (OLED) is a self-luminous element that does not require a separate light source, unlike a liquid crystal display device (LCD) having a backlight.

Therefore, the organic light emitting display device may be manufactured to be light and thin, is advantageous in processing, and has an advantage of low power consumption due to low voltage driving. Above all, the organic light emitting display device includes a self-light emitting element and each layer thereof may be formed of a thin organic thin film, so it has excellent flexibility and elasticity compared to other display devices.

Accordingly, organic light emitting display devices are widely used in various devices such as laptop computers, mobile phones, gaming devices, and navigation units.

Gaming devices have excellent color reproducibility, wide viewing angles, and excellent black visibility. However, there is a defect in which luminance is output low on a bright screen having a large area due to luminance limitation according to the area. Unlike TVs, which are watched by a large number of people from various viewing angles, gaming devices are viewed in front by individuals, so immersion is important in the gaming devices. Accordingly, to secure immersion, the gaming devices need to secure a high bright-room contrast ratio and high luminance.

Meanwhile, a conventional organic light emitting display device for games may be driven in a bottom emission method. However, there is a defect in which due to a low refractive index of indium tin oxide (ITO) used as an anode electrode, light emitted from an organic light emitting layer is lost by total reflection at respective interfaces while passing through the anode electrode and a substrate.

SUMMARY

Accordingly, the present disclosure is to provide an organic light emitting display device having high luminance and excellent visibility and color by improving light extraction efficiency through minimization of light loss.

The present disclosure is not limited to the above-mentioned and other features, which are not mentioned above, may be clearly understood by those skilled in the art from the following descriptions.

An organic light emitting display device according to an exemplary aspect of the present disclosure includes a substrate on which a plurality of sub-pixels are defined; a thin film transistor disposed on the substrate; a passivation layer disposed to cover the thin film transistor, a color filter layer disposed on the passivation layer, a planarization layer disposed on the color filter layer, an anode disposed on the planarization layer to correspond to each of the plurality of sub-pixels; a bank defining an emission area by covering an edge of the anode; at least one light emitting layer disposed on the anode; and a cathode disposed on the light emitting layer, wherein the anode includes indium oxide ($In_xO_y$) and molybdenum oxide ($MoO_z$).

Other detailed matters of the exemplary aspects are included in the detailed description and the drawings.

An organic light emitting display device according to the present disclosure may improve light extraction efficiency by minimizing loss of light extracted to the outside.

An organic light emitting display device according to the present disclosure provides effects of high luminance and excellent visibility and color by improving light extraction efficiency.

Accordingly, an organic light emitting display device according to the present disclosure may be implemented as a gaming device by improving a viewer's immersion.

The effects according to the present disclosure are not limited to the contents exemplified above, and more various effects are included in the present specification.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
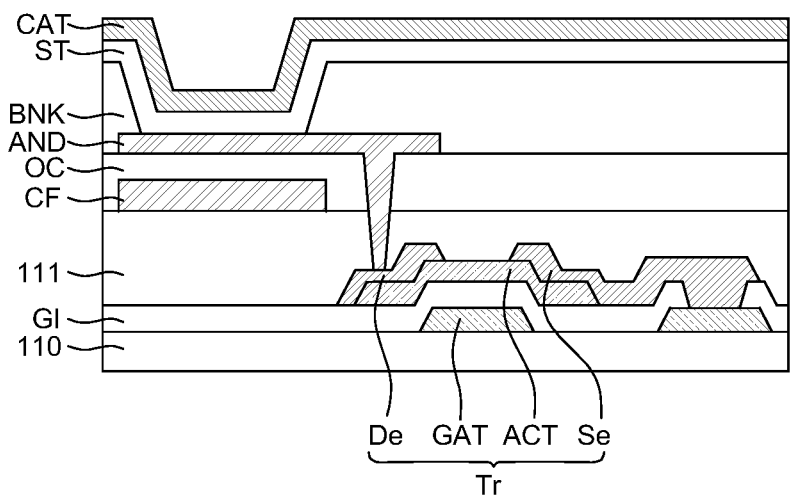
FIG. 1 is a schematic cross-sectional view of an organic light emitting display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art may fully understand the disclosures of the present disclosure and the scope of the present disclosure.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure may be partially or entirely adhered to or combined with each other and may be interlocked and operated in technically various ways, and the aspects may be carried out independently of or in association with each other.

Hereinafter, an organic light emitting display device according to exemplary aspects of the present disclosure will be described in detail with reference to accompanying drawings.

Figure 2:
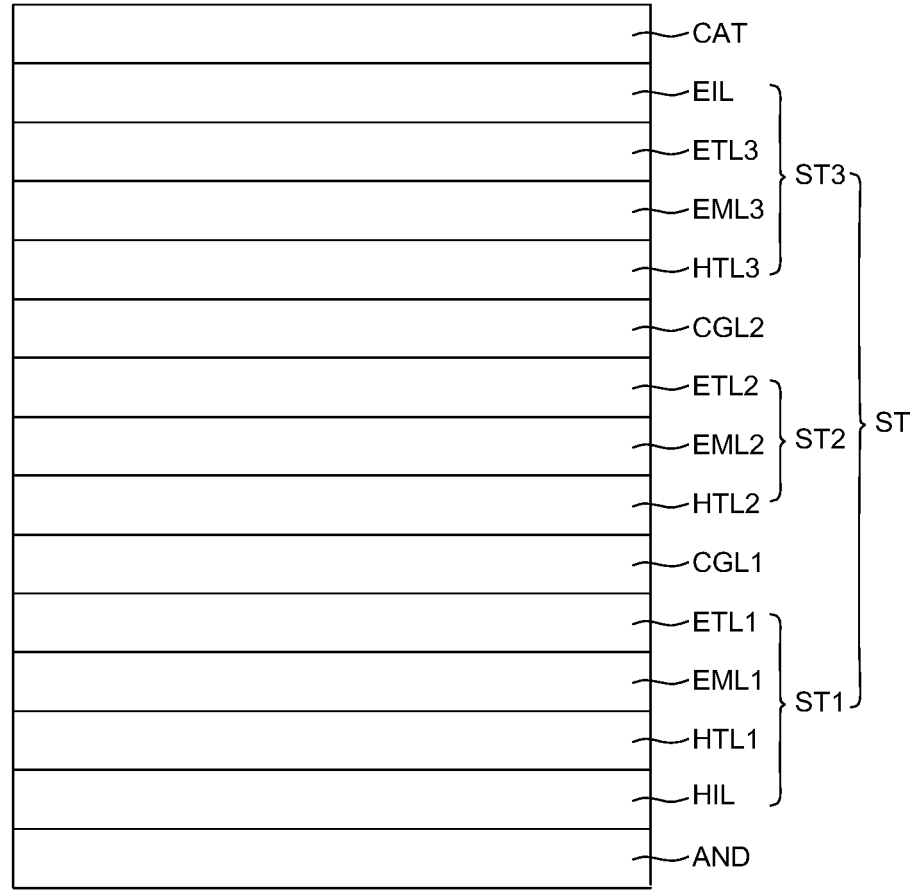
FIG. 2 is a schematic cross-sectional view of a light emitting stack disposed between an anode and a cathode in the organic light emitting display device according to an exemplary aspect of the present disclosure.

FIG. 1 is a schematic cross-sectional view of an organic light emitting display device according to an exemplary aspect of the present disclosure. FIG. 2 is a schematic cross-sectional view of a light emitting stack disposed between an anode and a cathode in the organic light emitting display device according to an exemplary aspect of the present disclosure.

Referring to FIG. 1, an organic light emitting display device 100 according to an exemplary aspect of the present disclosure includes a substrate 110, a thin film transistor Tr, a passivation layer 111, a color filter layer CF, a planarization layer OC, an anode AND, a light emitting stack ST, and a cathode CAT. The organic light emitting stack ST includes a first light emitting stack ST1, a second light emitting stack ST2, and a third light emitting stack ST3. Hereinafter, a structure in which the organic light emitting display device 100 of the present disclosure includes the first to third light emitting stacks ST1, ST2, and ST3 will be described as an example, but this is only one exemplary aspect of the present disclosure, and the present disclosure is not limited thereto.

The substrate 110 may be divided into an active area and a non-active area. The active area is an area in which a plurality of pixels are disposed to substantially display an image. The plurality of pixels and driving circuits for driving the pixels may be disposed in the active area. The non-active area surrounds the active area. The non-active area is an area in which images are not substantially displayed, and various lines, printed circuit boards, and the like for driving the pixels and driving circuits disposed in the active area are disposed in the non-active area.

The plurality of pixels may be disposed in a matrix shape, and each of the plurality of pixels includes a plurality of sub-pixels. The sub-pixel is an element for displaying one color, and includes an emission area in which light is emitted and a non-emission area in which light is not emitted. Each of the plurality of sub-pixels may be any one of a red sub-pixel, a green sub-pixel, a blue sub-pixel, and a white sub-pixel. In FIG. 1, only one sub-pixel is shown for convenience of description.

The substrate 110 supports various elements constituting the organic light emitting display device 100. The substrate 110 may be formed of a transparent insulating material. For example, the substrate may be a glass substrate having high strength and excellent optical properties and barrier properties.

A plurality of data lines and a plurality of gate lines are disposed to cross each other on the substrate 110 to define sub-pixel areas. The thin film transistor Tr is disposed at each of intersections of the data lines and the gate lines. The thin film transistor Tr includes a gate electrode GAT, an active layer ACT, a source electrode Se, and a drain electrode De. In the drawings, for convenience of description, only a driving thin film transistor for driving an organic light emitting element among various thin film transistors included in the organic light emitting display device 100 is illustrated, but the present disclosure is not limited thereto.

In addition, although the thin film transistor Tr is shown as having a bottom gate structure in the drawings, the present disclosure is not limited thereto. However, when the thin film transistor Tr is formed in a top gate structure, a light blocking layer may be added on the substrate to prevent damage to the active layer by external light.

The gate electrode GAT is disposed on the substrate 110, and the active layer ACT is disposed on the gate electrode GAT with a gate insulating layer GI interposed therebetween. The gate insulating layer GI is substantially formed on an entire surface of the substrate 110. The gate insulating layer GI insulates the gate electrode GAT and the active layer ACT. On the active layer ACT, the source electrode Se and the drain electrode De are disposed to be spaced apart from each other. The source electrode Se is disposed to cover one edge of the active layer ACT, and the drain electrode De is disposed to cover the other edge of the active layer ACT.

The passivation layer 111 is disposed on the thin film transistor Tr. The passivation layer 111 is substantially formed on the entire surface of the substrate 110. The passivation layer 111 prevents penetration of external moisture or oxygen and protects the thin film transistor Tr from being damaged in a subsequent process. In addition, the passivation layer 111 flattens an upper surface of the thin film transistor Tr. The passivation layer 111 may be formed as a single layer or multiple layers. In addition, the passivation layer 111 may be formed of an organic insulating material or an inorganic insulating material, and may include both a layer formed of an organic insulating material and a layer formed of an inorganic insulating material when it is formed in multiple layers.

The passivation layer 111 includes a contact hole for electrically connecting the anode AND and the drain electrode De of the thin film transistor Tr.

The organic light emitting display device 100 according to an exemplary aspect of the present disclosure is driven in a bottom emission method. That is, light emitted from the light emitting stack ST is emitted to the outside through the substrate 110 disposed in a rear of the light emitting stack ST. Accordingly, the color filter layer CF is provided on the passivation layer 111 to implement full color.

The color filter layer CF includes a plurality of color filters disposed to overlap with each of the sub-pixel areas. Each of the plurality of color filters is formed to match a color of the sub-pixel corresponding thereto. For example, a red color filter is disposed in a red sub-pixel area, a green color filter is disposed in a green sub-pixel area, and a blue color filter is disposed in a blue sub-pixel area. A color filter may not be disposed in a white sub-pixel area, or a white color filter may be disposed therein, if necessary. According to a design structure, the color filter layer CF may be omitted.

The color filter layer CF may be disposed to overlap with the emission areas of the respective sub-pixels. However, the present disclosure is not limited thereto, and the color filter layer CF may be disposed to completely overlap with the sub-pixel areas, if necessary or according to the design structure.

The planarization layer OC is disposed on the color filter layer CF. The planarization layer OC covers steps caused by the color filter layer CF and planarizes an upper surface of the color filter layer CF. The planarization layer OC is substantially formed on the entire surface of the substrate 110. The planarization layer OC may be formed of a transparent organic material. For example, the planarization layer OC may be formed of a transparent organic material such as photo-acryl, but the present disclosure is not limited thereto. The planarization layer OC includes a contact hole for electrically connecting the thin film transistor Tr and the anode AND.

The anode AND is disposed on the planarization layer OC. The anode AND is connected to the drain electrode De of the thin film transistor Tr through the contact holes provided in the passivation layer 111 and the planarization layer OC.

The anode AND is disposed to correspond to each of the plurality of sub-pixels. That is, the anode AND is disposed in each of the plurality of sub-pixels in a separated manner. The anode AND is formed of a transparent conductive material so that light emitted from the light emitting stack ST may be emitted to the outside through the substrate 110 disposed on the rear of the light emitting stack ST. Also, the anode AND is a component for supplying holes to the light emitting stack ST and is formed of a material having a high work function. For example, the anode AND may include indium oxide ($In_xO_y$) and molybdenum oxide ($MoO_z$). In this case, a refractive index of the anode AND is increased to minimize light loss, so that efficiency of light extracted to the outside through the substrate 110 may be improved. Accordingly, an effect of improving luminance of the organic light emitting display device 100 is provided. This will be described in detail later.

A bank BNK is disposed on the anode AND and the planarization layer OC. The bank BNK is disposed to cover an edge of the anode AND. That is, the bank BNK covers the edge of the anode AND to define the emission area. The bank BNK may partition the plurality of sub-pixels. The bank BNK may be formed of an insulating material to insulate the anodes AND of the sub-pixels adjacent to each other. For example, the bank BNK may be formed of polyimide, acrylic resin, benzocyclobutene, cardo-based resin, or the like, but is not limited thereto. The bank BNK may be formed of a black material to prevent color mixing between the adjacent sub-pixels.

The light emitting stack ST is disposed on the anode AND. The light emitting stack ST may be formed as a common layer instead of being separated for each of the plurality of sub-pixels. In this case, the light emitting stack ST is configured to emit white light. As described above, white light emitted from the light emitting stack ST is emitted as light of a color corresponding to each sub-pixel through the color filter layer CF. A specific configuration of the light emitting stack ST will be described in detail later.

The cathode CAT is disposed on the light emitting stack ST. The cathode CAT is not separated for each of the plurality of sub-pixels, and is formed as a common layer.

The cathode CAT may be formed of a metal material having a low work function to supply electrons to the light emitting stack ST. In addition, the cathode CAT may be formed of a metal material having high reflectivity to reflect light emitted from the light emitting stack ST in a direction toward the substrate 110. For example, the cathode CAT may be formed of gold (Au), silver (Ag), aluminum (Al), molybdenum (Mo), magnesium (Mg) or the like, or formed of an alloy thereof, but the present disclosure is not limited thereto.

Although not shown in the drawings, an encapsulation layer is disposed on the cathode CAT. The encapsulation layer minimizes deterioration of the light emitting stack ST by preventing an introduction of external moisture, oxygen, or foreign materials, and flattens an upper surface of the light emitting stack ST. For example, the encapsulation layer may be formed in a triple layer structure in which an organic encapsulation layer is stacked between two inorganic encapsulation layers, but the present disclosure is not limited thereto.

Hereinafter, the light emitting stack ST will be described in detail with reference to FIG. 2.

The light emitting stack ST includes the first light emitting stack ST1, the second light emitting stack ST2, and the third light emitting stack ST3. Each of the first light emitting stack ST1, the second light emitting stack ST2, and the third light emitting stack ST3 includes at least one light emitting layer. Light emitted from the first light emitting stack ST1, light emitted from the second light emitting stack ST2, and light emitted from the third light emitting stack ST3 are mixed, so that the light emitting stack ST emits white light.

The first light emitting stack ST1 includes a hole injection layer HIL, a first hole transport layer HTL1, a first light emitting layer EML1, and a first electron transport layer ETL1. The second light emitting stack ST2 includes a second hole transport layer HTL2, a second light emitting layer EML2, and a second electron transport layer ETL2. The third light emitting stack ST3 includes a third hole transport layer HTL3, a third light emitting layer EML3, a third electron transport layer ETL3, and an electron injection layer EIL.

A first charge generation layer CGL1 is disposed between the first light emitting stack ST1 and the second light emitting stack ST2, and a second charge generation layer CGL2 is disposed between the second light emitting stack ST2 and the third light emitting stack ST3.

The hole injection layer HIL is disposed on the anode AND. The hole injection layer HIL is disposed between the anode AND formed of an inorganic material and the first hole transport layer HTL1 formed of an organic material to improve interface characteristics. For example, the hole injection layer HIL may be any one material selected from among 4,4′, 4″-tris (3-methylphenylphenylamino) triphenylamine (MTDATA and m-MTDATA); copper phthalocyanine (CuPc); tris (4-carbazoyl-9-yl-phenyl) amine (TCTA); N, N′-diphenyl-N,N′-bis(1-naphthyl)-1,1′-biphenyl-4,4″-diamine (N,N′-diphenyl-N,N′-bis(1-naphthyl)-1,1′-biphenyl-4,4″-diamine (NPD and α-NPB); 1,4,5,8,9,11-hexaazatriphenylenehexacarbonitrile (HAT-CN); 1,3,5-tris [4-(diphenylamino) phenyl] benzene (1,3,5-tris [4-(diphenylamino) phenyl] benzene (TDAPB); poly(3,4-ethylenedioxythiophene)polystyrene sulfonate (PEDOT/PSS); 2,3,5,6-tetrafluoro-7,7,8,8-tetracyanoquinodimethane (F4TCNQ); and/or N-(biphenyl-4-yl)-9,9-dimethyl-N-(4-(9-phenyl-9H-carbazol-3-yl)phenyl)-9H-fluoren-2-amine, and the like.

Each of the first hole transport layer HTL1, the second hole transport layer HTL2, and the third hole transport layer HTL3 improves hole transport characteristics. The first hole transport layer HTL1 is disposed between the anode AND and the first light emitting layer EML1, the second hole transport layer HTL2 is disposed between the first charge generation layer CGL1 and the second light emitting layer EML2, and the third hole transport layer HTL3 is disposed between the second charge generation layer CGL2 and the third light emitting layer EML3. Accordingly, each of the first hole transport layer HTL1, the second hole transport layer HTL2, and the third hole transport layer HTL3 allows for smooth transfer of holes to the first light emitting layer EML1, the second light emitting layer EML2, and the third light emitting layer EML3.

For example, each of the first hole transport layer HTL1, the second hole transport layer HTL2, and the third hole transport layer HTL3 may be independently formed of at least one material selected from among N,N′-diphenyl-N, N′-bis(3-methylphenyl)-1,1′-biphenyl-4,4′-diamine (TPD); NPD; MTDATA; 1,3-bis (N-carbazolyl) benzene (1,3-bis (N-carbazolyl) benzene (mCP); CuPC; TCTA; tris (trifluorovinyl ether)-tris (4-carbazoyl-9-yl-phenyl)amine (TFV-TCTA); tris [4-(diethylamino) phenyl]amine; N-(biphenyl-4-yl)-9,9-dimethyl-N-(4-(9-phenyl-9H-carbazol-3-yl)phenyl)-9H-fluoren-2-amine; tri-p-tolylamine; N-[1,1′-biphenyl]-4-yl-9,9-dimethyl-N-[4-(9-phenyl-9H-carbazol-3-yl) phenyl]-amine; 4,4′-bis(N-carbazolyl)-1,1′-biphenyl(4, 4′-bis(N-carbazolyl)-1,1′-biphenyl (CBP) and/or 1,1-bis(4-(N,N′-di(p-tolyl)amino)phenyl)cyclohexane (1,1-bis(4-(N, N′-di(ptolyl)amino)phenyl)cyclohexane (TAPC), and the like.

To further improve hole transport characteristics selectively, if necessary, an auxiliary hole transport layer may additionally be disposed on an upper portion of the first hole transport layer HTL1, an upper portion of the second hole transport layer HTL2, and an upper portion of the third hole transport layer HTL3.

Each of the first light emitting layer EML1, the second light emitting layer EML2, and the third light emitting layer EML3 includes an organic light emitting material. Accordingly, each of the first light emitting layer EML1, the second light emitting layer EML2, and the third light emitting layer EML3 emits light through excitons formed by combining holes and electrons. The first light emitting layer EML1 is disposed on the first hole transport layer HTL1, the second light emitting layer EML2 is disposed on the second hole transport layer HTL2, and the third light emitting layer EML3 is disposed on the third hole transport layer HTL3.

For example, each of the first light emitting layer EML1, the second light emitting layer EML2, and the third light emitting layer EML3 independently includes a light emitting material selected from a blue light emitting material, a red light emitting material, a green light emitting material, a yellow light emitting material, and a greenish yellow light emitting material. The respective light emitting layers EML1, EML2, and EML3 are configured to emit light of different colors. Accordingly, light of different colors is mixed, so that the light emitting stack ST emits white light. However, the present disclosure is not limited thereto, and two light emitting layers among a plurality of the light emitting layers EML1, EML2, and EML3 may emit light of the same color if necessary or according to a design structure.

Each of the light emitting layers EML1, EML2, and EML3 may include a host material and a light emitting dopant.

For example, when emitting blue light, the light emitting layer may include a material selected from among 4,4′-bis (2,2′-diphenylvinyl)-1,1′-biphenyl (4,4′-bis(2,2′-diphenylyinyl)-1,1′-biphenyl (DPVBi); 9,10-di-(2-naphthyl) anthracene (ADN); 2,5,8,11-tetra-t-butylperylene (TBADN); 2-tert-butyl-9,10-di (2-naphthyl) anthracene; 2-methyl-9,10-di(2-naphthyl)anthracene (MADN); and/or 2,2′,2″-(1,3,5-benzinetriyl)-tris(1-phenyl-1-H-benzimidazole (TBPi), and the like, which are blue host materials, but the present disclosure is not limited thereto.

For example, the blue dopant material may be selected from 4,4′-bis(9-ethyl-3-carbazovinylene)-1,1′-biphenyl (BCzVBi) and/or diphenyl-[4-(2-[1,1;4,1]tetraphenyl-4-yl-vinyl)-phenyl]-amine (BD-1), spiro-DPVBi, spiro-CBP, distyrylbenzene (DSB) and its derivatives, distyryl arylene (DSA) and its derivatives, polyfluorene (PF)-based polymers and polyphenylene vinylene (PPV)-based polymers, iridium-based dopants, and the like, but the present disclosure is not limited thereto.

For example, when emitting green light, a host such as CBP, tris (8-hydroxyquinolinato) aluminum (Alq), and an iridium-based dopant such as dp₂Ir(acac) and op₂Ir(acac) may be used, but the present disclosure is not limited thereto.

For example, when emitting red light, the light emitting layer may include a host such as CBP, and a dopant selected from among bis(1-henylisoquinoline)acetylacetonate iridium (PIQIr(acac)), bis(1-phenylquinoline)acetylacetonate iridium (PQIr(acac)) and octaethylporphyrin platinum (PtOEP) or the like, but the present disclosure is not limited thereto.

For example, when emitting yellow light, the light emitting layer may be configured as a single layer including a yellowish green light emitting material or configured by stacking a light emitting layer including a yellowish green light emitting material and a light emitting layer including a green light emitting material. For example, at least one host selected from CBP and bis (2-methyl-8-quinolinolate)-4-(phenylphenolato) aluminum (bis (2-methyl-8-quinolinolate)-4-(phenylphenolato) aluminum (BAlq), and a yellowish green phosphorescent dopant may be used, but the present disclosure is not limited thereto.

If necessary, an auxiliary light emitting layer may be selectively, additionally disposed on an upper portion or a lower portion of at least one layer among the first light emitting layer EML1, the second light emitting layer EML2, and the third light emitting layer EML3 to secure charge balance of electrons and holes and improve lifespan and efficiency.

Each of the first electron transport layer ETL1, the second electron transport layer ETL2, and the third electron transport layer ETL3 improves electron transportability. The first electron transport layer ETL1 is disposed between the first light emitting layer EML1 and the first charge generation layer CGL1, the second electron transport layer ETL2 is disposed between the second light emitting layer EML2 and the second charge generation layer CGL2, and the third electron transport layer ETL3 is disposed between the third light emitting layer EML3 and the electron injection layer EIL. Accordingly, the first electron transport layer ETL1, the second electron transport layer ETL2, and the third electron transport layer ETL3 improve characteristics of transferring electrons to the first light emitting layer EML1, the second light emitting layer EML2, and the third light emitting layer EML3.

For example, each of the first electron transport layer ETL1, the second electron transport layer ETL2, and the third electron transport layer ETL3 may be independently formed of a material selected from among Alq3; 2-biphenyl-4-yl-5-(4-t-butylphenyl)-1,3,4-oxadiazole (PBD); spiro-PBD; lithium quinolate (Liq); 2-[4-(9,10-di-2-naphthalenyl-2-anthracenyl)phenyl]-1-phenyl-1H-benzimidazole; 3-(biphenyl-4-yl)-5-(4-tertbutylphenyl)-4-phenyl-4H-1,2,4-triazole (TAZ); 4,7-diphenyl-1,10-phenanthroline (Bphen); tris (phenylquinoxaline) (TPQ); and 1,3,5-tris(Nphenylbenzimiazole-2-yl)benzene (TPBI), but the present disclosure is not limited thereto.

The electron injection layer EIL is disposed between the third electron transport layer ETL3 and the cathode CAT. The electron injection layer EIL facilitates injection of electrons supplied from the cathode CAT. For example, the electron injection layer EIL may be formed of one of LiF, NaF, KF, RbF, CsF, FrF, BeF$_2$, MgF$_2$, CaF$_2$, SrF$_2$, BaF$_2$ and RaF$_2$, Liq (lithium quinolate), lithium benzoate, sodium stearate, Alq3, BAlq, PBD, spiro-PBD, TAZ, and the like, but the present disclosure is not limited thereto.

The first charge generation layer CGL1 is disposed between the first light emitting stack ST1 and the second light emitting stack ST2, and the second charge generation layer CGL2 is disposed between the second light emitting stack ST2 and the third light emitting stack ST3. The first charge generation layer CGL1 includes an N-type charge generation layer adjacent to the first light emitting stack ST1 and a P-type charge generation layer adjacent to the second light emitting stack ST2. In addition, the second charge generation layer CGL2 includes an N-type charge generation layer positioned adjacent to the second light emitting stack ST2 and a P-type charge generation layer positioned adjacent to the third light emitting stack ST3. The N-type charge generation layer injects electrons into the first light emitting stack ST1 and the second light emitting stack ST2 and the P-type charge generation layer injects holes into the second light emitting stack ST2 and the third light emitting stack ST3.

For example, the N-type charge generation layer may include a host material such as 4,7-diphenyl-1,10-phenanthroline (Bphen), or MTDATA, and a dopant selected from alkali metals such as Li, Na, K and Cs and/or alkaline earth metals such as Mg, Sr, Ba, and Ra, but the present disclosure is not limited thereto.

For example, the P-type charge generation layer may include one of NPD, HAT-CN, F4TCNQ, TPD, N,N,N',N'-tetranaphthalenyl-benzidine (TNB), TCTA, N,N'-dioctyl-3, 4,9,10-perylenedicarboximide (PTCDI-C8), and the like, but the present disclosure is not limited thereto.

Figure 3:
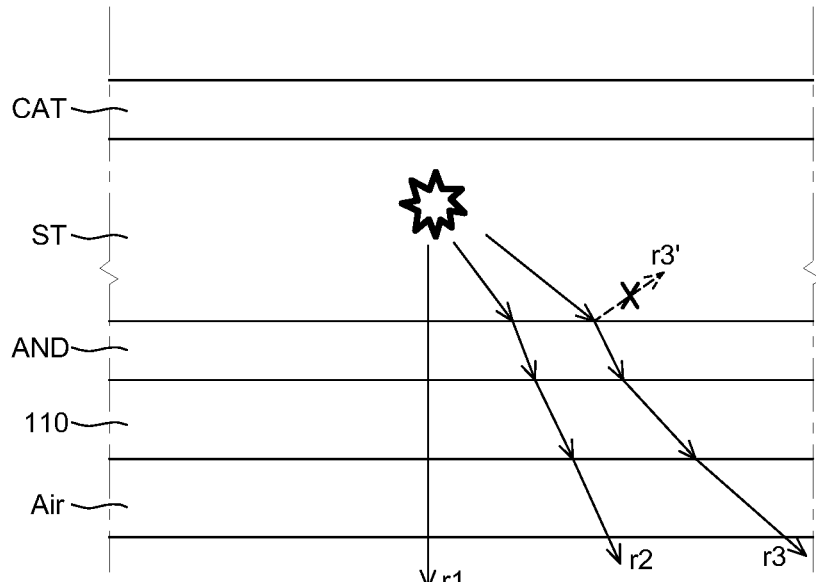
FIG. 3 is a diagram showing a process in which light emitted from the light emitting stack passes through a substrate in the organic light emitting display device of the present disclosure.

Hereinafter, an effect of increasing light extraction efficiency of the organic light emitting display device 100 according to an exemplary aspect of the present disclosure will be described with reference to FIG. 3. FIG. 3 is a diagram for explaining that light emitted from the light emitting stack ST is emitted through the substrate 100 in the organic light emitting display device 100 of the present disclosure.

As described above, light emitted from the first light emitting stack ST1, light emitted from the second light emitting stack ST2, and light emitted from the third light emitting stack ST3 are mixed to emit white light. The light emitted in this way is emitted to the outside through the substrate 110 disposed in the rear of the light emitting stack ST.

In the case of a conventional organic light emitting display device, when light emitted from a light emitting stack is emitted through a substrate, light loss occurs due to total reflection at interfaces of respective layers thereof. Accordingly, there is a defect in which efficiency of the light emitted to the outside is reduced, thereby leading to a decrease in luminance.

Accordingly, in the organic light emitting display device 100 according to an exemplary aspect of the present disclosure, indium oxide ($In_xO_y$) and molybdenum oxide ($MoO_z$) are applied as the anode AND to increase light extraction efficiency. That is, the anode AND is formed by depositing indium oxide ($In_xO_y$) and molybdenum oxide ($MoO_z$). As such, when the anode AND is formed by mixing indium oxide ($In_xO_y$) and molybdenum oxide ($MoO_z$), a refractive index of the anode AND increases, light extraction efficiency may be improved.

Indium oxide ($In_xO_y$) has a refractive index of 1.7 to 1.9, whereas molybdenum oxide ($MoO_z$) has a high refractive index of 2.1 to 2.3. Accordingly, when molybdenum oxide ($MoO_z$) is applied to and mixed with indium oxide ($In_xO_y$), the refractive index of the anode AND increases and an extinction coefficient approaches 0, so that light extraction efficiency may be improved.

In this regard, referring to FIG. 3, in the case of a conventional organic light emitting display device, r1 and r2 having large incident angles among light emitted from the light emitting stack ST are emitted to the outside through the anode AND and the substrate 110, but there is a defect in which some light r3' having an incident angle smaller than a critical angle is not emitted to the outside due to total reflection occurring at an interface between the light emitting stack ST and the anode AND.

However, the anode AND according to an exemplary aspect of the present disclosure is formed by including indium oxide ($In_xO_y$) and molybdenum oxide ($MoO_z$), and thus exhibits a higher refractive index and a lower extinction coefficient than those of conventional anodes. Accordingly, the light r3 incident at an angle smaller than the critical angle may be emitted to the outside through the substrate 110 without being totally reflected at the interface of the anode AND. As the light extraction efficiency improves, the organic light emitting display device 100 according to an exemplary aspect of the present disclosure provides improved luminance compared to a conventional organic light emitting display device.

For example, indium oxide ($In_xO_y$) may be indium (III) oxide ($In_2O_3$), and molybdenum oxide ($MoO_z$) may be at least one selected from molybdenum trioxide ($MoO_3$) and molybdenum dioxide ($MoO_2$). Indium oxide ($In_xO_y$) may be molybdenum trioxide ($MoO_3$). In this case, the refractive index of the anode AND is increased and the extinction coefficient is lowered, so that light extraction efficiency may be further improved.

The refractive index of the anode AND may be adjusted by a ratio of indium oxide ($In_xO_y$) and molybdenum oxide ($MoO_z$). For example, the anode AND may include 15 wt % to 60 wt % of indium oxide ($In_xO_y$) and 40 wt % to 85 wt % of molybdenum oxide ($MoO_z$). Within this range, light extraction efficiency is improved while electrical characteristics are excellent, providing an effect of excellent luminance.

The anode AND may further include a dopant. For example, the dopant may be niobium oxide ($Nb_aO_b$). Specifically, for example, the dopant may be niobium pentoxide ($Nb_2O_5$). Since the niobium oxide ($Nb_aO_b$) has a high refractive index of about 2.5, an increase in refractive index may be made by adding the niobium oxide ($Nb_aO_b$), and accordingly, luminance may be further improved.

For example, the light emitting stack ST including the plurality of light emitting layers EML1, EML2, and EML3 may have a refractive index of 1.6 to 1.8, and the anode AND may have a refractive index of 2.1 to 2.3. Accordingly, loss of light emitted from the light emitting stack ST at the interface of the anode AND may be minimized to improve light extraction efficiency, so that luminance of the organic light emitting display device 100 may be improved.

Meanwhile, in a conventional organic light emitting display device, an anode is thickly deposited with a thickness of 110 nm or more to compensate for luminance due to a low refractive index of the anode. Unlike this, in the organic light emitting display device 100 according to an exemplary aspect of the present disclosure, the anode AND is deposited with a thickness of 65 nm to 100 nm, which is thinner than that in a conventional case. Even when it is deposited with such a thin thickness, the refractive index of the anode AND is improved to thereby allow for higher luminance compared to the conventional case.

The organic light emitting display device 100 has characteristics in which light efficiency is increased due to a micro-cavity effect in which light emitted from the light emitting layers EML1, EML2, and EML3 causes repeated reflections between an anode AND and the cathode CAT.

However, when the refractive index of the anode AND is increased, the micro-cavity effect is reduced, and to compensate for the reduction in micro-cavity effect, thicknesses of some layers may be adjusted. For example, a thickness of the first hole transport layer HTL1 and/or the third hole transport layer HTL3 may be adjusted according to the refractive index of the anode AND.

For example, the thickness of the first hole transport layer HTL1 may be greater than the thickness of the third hole transport layer HTL3 and a thickness of the anode AND. The thickness of the anode AND may be greater than or less than that of the third hole transport layer HTL3.

For example, the thickness of the first hole transport layer HTL1 may be 100 nm to 130 nm, the thickness of the third hole transport layer HTL3 may be 70 nm to 90 nm, and the thickness of the anode AND may be 65 nm to 100 nm. Within this range, in addition to an improvement in light extraction efficiency according to an increase in the refractive index of the anode AND, the micro-cavity effect is reinforced, so that luminance is further improved.

For example, the thickness of the first hole transport layer HTL1 may be 110 nm to 130 nm, the thickness of the third hole transport layer HTL3 may be 80 nm to 90 nm, and the thickness of the anode AND may be 70 nm to 90 nm. Within this range, the micro-cavity effect may be further enhanced to provide higher luminance.

The organic light emitting display device 100 according to an exemplary aspect of the present disclosure exhibits a luminance improvement effect at a viewing angle of 30° or less. Accordingly, it is more advantageous to apply the organic light emitting display device 100 of the present disclosure to gaming devices that provide high display quality at a viewing angle narrow than those of devices such as TVs which are watched by a large number of people from various viewing angles.

Hereinafter, effects of the present disclosure described above will be described in more detail through Examples and Comparative Examples. However, the following examples are for illustration of the present disclosure, and the scope of the present disclosure is not limited by the following examples.

Experimental Example 1

Samples having the structure shown in FIG. 2 were prepared by varying compositions and thicknesses of anodes as follows, and luminous efficiency and color coordinates of each of the samples were analyzed. In the following, a thickness of each sample is applied after analyzing an optimal thickness thereof according to an anode composition and a refractive index of each sample through simulation. The consequent results are shown in Tables 1 to 6, and FIGS. 4 and 5 below.

Figure 4:
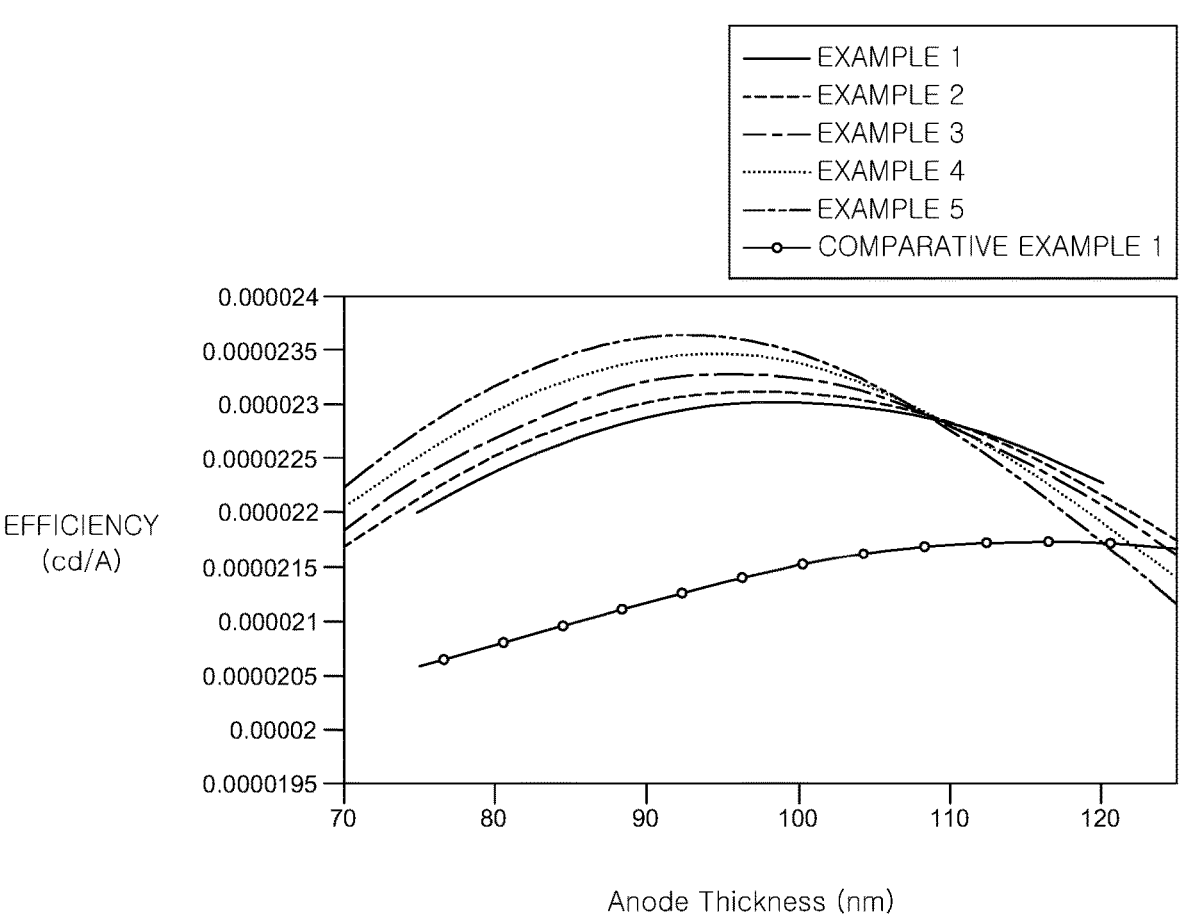
FIG. 4 is a graph showing front luminous efficiency according to anode thicknesses of Examples 1 to 6 and Comparative Example 1.

FIG. 4 is a graph showing front luminous efficiency according to anode thicknesses of Examples 1 to 6 and Comparative Example 1.

Figure 5:
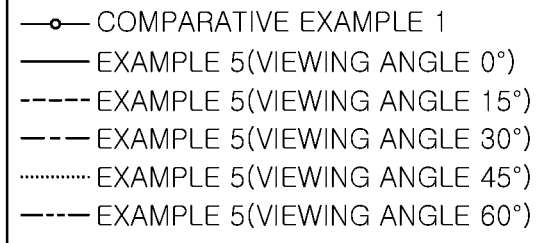
FIG. 5 is emission spectra of Comparative Example 1 and Example 5.
Figure 5:
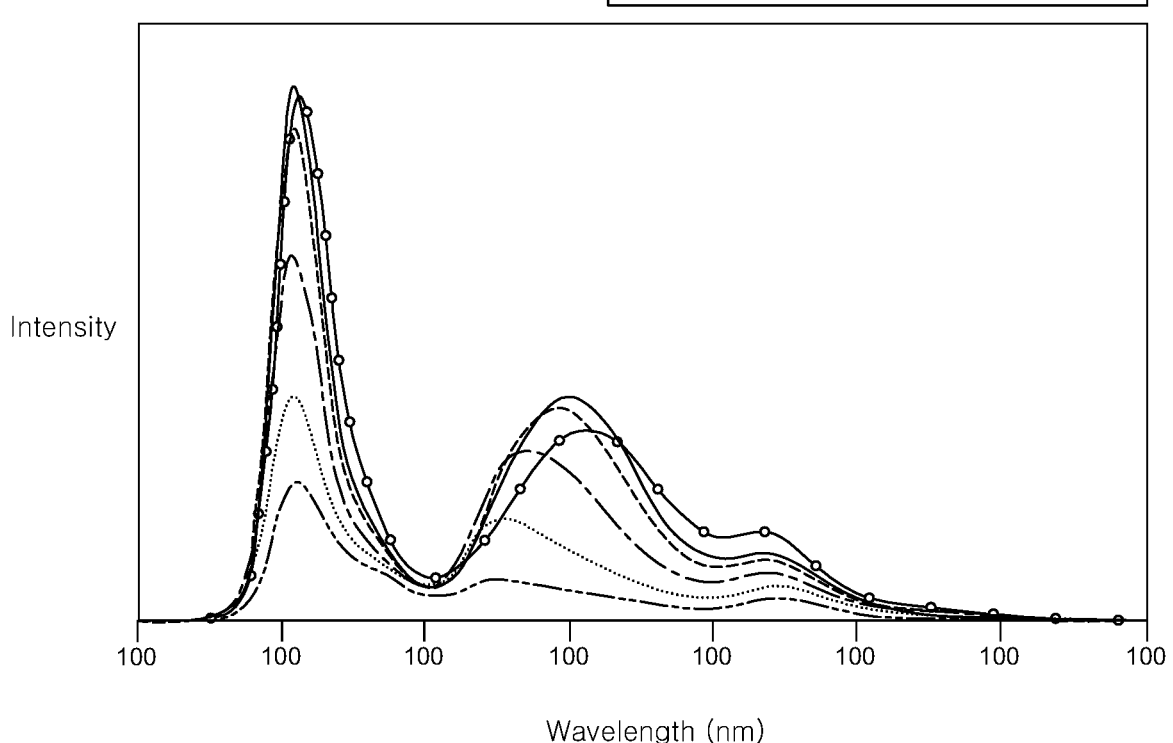

FIG. 5 is emission spectra of Comparative Example 1 and Example 5.

In Tables 1 to 6, relative efficiency represents the efficiency by viewing angle of each Example compared to the efficiency by viewing angle of Comparative Example 1 as a percentage.

Example 1: $MoO_3$:$In_2O_3$=40 wt %: 60 wt %, thickness 99 nm

Example 2: $MoO_3$:$In_2O_3$=49 wt %: 51 wt %, thickness 97 nm

Example 3: $MoO_3$:$In_2O_3$=60 wt %: 40 wt %, thickness 96 nm

Example 4: $MoO_3$:$In_2O_3$=72 wt %: 28 wt %, thickness 94 nm

Example 5: $MoO_3$:$In_2O_3$=85 wt %: 15 wt %, thickness 92 nm

Comparative Example 1: Indium Tin Oxide (ITO) 100%, Thickness 115 nm

TABLE 1

| | Example 1 | | | | | |
| Viewing Angle (°) | Efficiency ($10^{-5}$ cd/A) | Relative Efficiency | CIEx | CIEy | u' | v' |
|---|---|---|---|---|---|---|
| 0 | 2.30 | 107% | 0.267 | 0.286 | 0.181 | 0.436 |
| 15 | 2.16 | 106% | 0.263 | 0.287 | 0.178 | 0.436 |
| 30 | 1.72 | 101% | 0.254 | 0.291 | 0.170 | 0.438 |
| 45 | 1.08 | 95% | 0.245 | 0.284 | 0.166 | 0.432 |
| 60 | 0.55 | 94% | 0.236 | 0.250 | 0.170 | 0.407 |

TABLE 2

| | Example 2 | | | | | |
|---|---|---|---|---|---|---|
| Viewing Angle (°) | Efficiency ($10^{-5}$ cd/A) | Relative Efficiency | CIEx | CIEy | u' | v' |
| 0 | 2.31 | 108% | 0.266 | 0.288 | 0.180 | 0.438 |
| 15 | 2.17 | 106% | 0.262 | 0.290 | 0.176 | 0.438 |
| 30 | 1.71 | 101% | 0.252 | 0.293 | 0.168 | 0.439 |
| 45 | 1.07 | 94% | 0.244 | 0.283 | 0.165 | 0.431 |
| 60 | 0.54 | 92% | 0.234 | 0.248 | 0.170 | 0.405 |

TABLE 3

| | Example 3 | | | | | |
|---|---|---|---|---|---|---|
| Viewing Angle (°) | Efficiency ($10^{-5}$ cd/A) | Relative Efficiency | CIEx | CIEy | u' | v' |
| 0 | 2.33 | 109% | 0.265 | 0.290 | 0.178 | 0.439 |
| 15 | 2.18 | 107% | 0.261 | 0.291 | 0.174 | 0.439 |
| 30 | 1.71 | 101% | 0.250 | 0.294 | 0.166 | 0.439 |
| 45 | 1.06 | 94% | 0.241 | 0.283 | 0.163 | 0.431 |
| 60 | 0.54 | 91% | 0.233 | 0.246 | 0.170 | 0.404 |

TABLE 4

| | Example 4 | | | | | |
|---|---|---|---|---|---|---|
| Viewing Angle (°) | Efficiency ($10^{-5}$ cd/A) | Relative Efficiency | CIEx | CIEy | u' | v' |
| 0 | 2.34 | 109% | 0.264 | 0.292 | 0.177 | 0.440 |
| 15 | 2.19 | 107% | 0.259 | 0.294 | 0.172 | 0.440 |
| 30 | 1.71 | 101% | 0.248 | 0.296 | 0.164 | 0.440 |
| 45 | 1.04 | 93% | 0.239 | 0.284 | 0.161 | 0.431 |
| 60 | 0.53 | 89% | 0.231 | 0.244 | 0.169 | 0.402 |

TABLE 5

| | Example 5 | | | | | |
|---|---|---|---|---|---|---|
| Viewing Angle (°) | Efficiency ($10^{-5}$ cd/A) | Relative Efficiency | CIEx | CIEy | u' | v' |
| 0 | 2.36 | 110% | 0.263 | 0.295 | 0.175 | 0.441 |
| 15 | 2.20 | 108% | 0.258 | 0.296 | 0.171 | 0.442 |
| 30 | 1.71 | 101% | 0.246 | 0.299 | 0.162 | 0.441 |
| 45 | 1.03 | 91% | 0.237 | 0.284 | 0.160 | 0.431 |
| 60 | 0.52 | 88% | 0.230 | 0.242 | 0.169 | 0.400 |

TABLE 6

| | Comparative Example 1 | | | | | |
|---|---|---|---|---|---|---|
| Viewing Angle (°) | Efficiency ($10^{-5}$ cd/A) | Relative Efficiency | CIEx | CIEy | u' | v' |
| 0 | 2.14 | 100% | 0.276 | 0.272 | 0.193 | 0.429 |
| 15 | 2.04 | 100% | 0.271 | 0.271 | 0.190 | 0.427 |
| 30 | 1.69 | 100% | 0.261 | 0.273 | 0.182 | 0.427 |
| 45 | 1.13 | 100% | 0.250 | 0.277 | 0.172 | 0.428 |
| 60 | 0.59 | 100% | 0.237 | 0.264 | 0.166 | 0.417 |

Referring to Tables 1 to 6 and FIG. 4 together, it may be confirmed that in the samples of Examples 1 to 6 including anodes deposited with 40 wt % to 85 wt % $MoO_3$ and 15 wt % to 60 wt % $In_2O_3$, luminous efficiency is greatly improved within a viewing angle range of 0° (front) to 30° while color coordinates are identical, compared to the sample of Comparative Example 1 formed of ITO. In the case of Examples 1 to 5, the thickness of the anode may be reduced by about 16 nm to 23 nm compared to Comparative Example 1 as the refractive index of the anode increases.

In addition, referring to FIG. 5, it may be confirmed that in the samples according to Examples 1 to 6, wavelengths thereof are blue-shifted and a large improvement in luminance may be seen, compared to the sample of Comparative Example 1. In general, organic light emitting display devices have a defect in that lifespan of blue and green sub-pixels is shorter than that of red sub-pixels. According to the present disclosure, it is possible to improve luminance of blue and green sub-pixels, so that a reduction in lifespan of conventional blue and green sub-pixels may be compensated.

Meanwhile, according to an exemplary aspect of the present disclosure, since excellent luminance within a viewing angle range of 0° (front) to 30° is exhibited, it may be more advantageously applied to gaming devices in which immersion is important.

Experimental Example 2

Luminous efficiency (viewing angle of 0°) and color coordinates of samples in which thicknesses of the first hole transport layer HTL1 and the third hole transport layer HTL3 are optimized to compensate for a decrease in microcavity effect due to an increase in the refractive index of the anodes to which a new material is applied, were analyzed. Consequent results thereof are shown in Table 7 below.

TABLE 7

| | HTL1/HTL3/AND Thickness (nm) | Efficiency ($10^{-5}$ cd/A) | Relative Efficiency | CIEx | CIEy | u' | v' |
|---|---|---|---|---|---|---|---|
| Comparative Example 1 | 105/75/115 | 2.14 | 100% | 0.276 | 0.272 | 0.193 | 0.429 |
| Example 1 | 105/75/99 | 2.34 | 109% | 0.264 | 0.292 | 0.177 | 0.440 |
| Example 1a | 120/85/79 | 2.43 | 113% | 0.281 | 0.282 | 0.193 | 0.436 |
| Example 2 | 105/75/97 | 2.31 | 108% | 0.266 | 0.288 | 0.180 | 0.438 |
| Example 2a | 120/85/77 | 2.46 | 115% | 0.280 | 0.284 | 0.192 | 0.437 |
| Example 3 | 105/75/96 | 2.33 | 109% | 0.265 | 0.290 | 0.178 | 0.439 |
| Example 3a | 120/85/76 | 2.49 | 116% | 0.280 | 0.285 | 0.191 | 0.438 |
| Example 4 | 105/75/96 | 2.34 | 109% | 0.264 | 0.292 | 0.177 | 0.440 |
| Example 4a | 120/85/75 | 2.52 | 118% | 0.279 | 0.287 | 0.190 | 0.439 |
| Example 5 | 105/75/92 | 2.36 | 110% | 0.263 | 0.295 | 0.175 | 0.441 |
| Example 5a | 115/85/70 | 2.55 | 119% | 0.285 | 0.295 | 0.191 | 0.445 |

Referring to Table 7, in Examples 1a to 5a in which thicknesses of the anodes decrease and thicknesses of the first hole transport layer HTL1 and the third hole transport layer HTL3 increase compared to Examples 1 to 5, to compensate for the decrease in the micro-cavity effect due to the increase in the refractive index of the anodes of Examples 1 to 5, it may be confirmed that efficiency is improved. Accordingly, a high-quality organic light emitting display device may be provided by further improving luminous efficiency compared to Comparative Example 1.

The exemplary aspects of the present disclosure may also be described as follows:

According to an aspect of the present disclosure, an organic light emitting display device comprises: a substrate on which a plurality of sub-pixels are defined; a thin film transistor disposed on the substrate; a passivation layer disposed to cover the thin film transistor; a color filter layer disposed on the passivation layer; a planarization layer disposed on the color filter layer, an anode disposed on the planarization layer to correspond to each of the plurality of sub-pixels; a bank defining an emission area by covering an edge of the anode; at least one light emitting layer disposed on the anode; and a cathode disposed on the light emitting layer, wherein the anode includes indium oxide ($In_xO_y$) and molybdenum oxide ($MoO_z$).

The indium oxide ($In_xO_y$) may be indium (III) oxide ($In_2O_3$), and the molybdenum oxide ($MoO_z$) may be at least one selected from molybdenum trioxide ($MoO_3$) and molybdenum dioxide ($MoO_2$).

The anode may include 15 wt % to 60 wt % of indium oxide ($In_xO_y$) and 40 wt % to 85 wt % of molybdenum oxide ($MoO_z$).

The anode may further include a dopant.

The dopant may be niobium oxide ($Nb_aO_b$).

The light emitting layer may have a refractive index of 1.6 to 1.8, and the anode may have a refractive index of 2.1 to 2.3.

The anode may have a thickness of 65 nm to 100 nm.

The light emitting layer may include a first light emitting layer disposed on the anode, a second light emitting layer disposed on the first light emitting layer, and a third light emitting layer disposed on the second light emitting layer.

The organic light emitting display device may further comprise: a first hole transport layer disposed on the anode; the first light emitting layer disposed on the first hole transport layer, a first charge generation layer disposed on the first light emitting layer, a second hole transport layer disposed on the first charge generation layer, the second light emitting layer disposed on the second hole transport layer; a second charge generation layer disposed on the second light emitting layer, a third hole transport layer disposed on the second charge generation layer, the third light emitting layer disposed on the third hole transport layer, and the cathode disposed on the third light emitting layer.

The first hole transport layer may have a thickness of 100 nm to 130 nm, the third hole transport layer may have a thickness of 70 nm to 90 nm, and the anode may have a thickness of 65 nm to 100 nm.

A thickness of the first hole transport layer may be greater than a thickness of the third hole transport layer and a thickness of the anode, and the thickness of the anode may be greater than or less than the thickness of the third hole transport layer.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device, comprising:
a substrate on which a plurality of sub-pixels are defined;
a thin film transistor disposed on the substrate;
a passivation layer disposed to cover the thin film transistor;
a color filter layer disposed on the passivation layer;
a planarization layer disposed on the color filter layer;
an anode disposed on the planarization layer and corresponding to each of the plurality of sub-pixels;
a bank defining an emission area by covering an edge of the anode;
at least one light emitting layer disposed on the anode; and
a cathode disposed on the light emitting layer,
wherein the anode includes 15 wt % to 60 wt % of indium oxide ($In_xO_y$) and 40 wt % to 85 wt % of molybdenum oxide ($MoO_z$).

2. The organic light emitting display device of claim 1, wherein the indium oxide ($In_xO_y$) includes indium (III) oxide ($In_2O_3$), and the molybdenum oxide ($MoO_z$) includes one of molybdenum trioxide ($MoO_3$) and molybdenum dioxide ($MoO_2$).

3. The organic light emitting display device of claim 1, wherein the anode further includes a dopant.

4. The organic light emitting display device of claim 3, wherein the dopant includes niobium oxide ($Nb_aO_b$).

5. The organic light emitting display device of claim 1, wherein the light emitting layer has a refractive index of 1.6 to 1.8, and the anode has a refractive index of 2.1 to 2.3.

6. The organic light emitting display device of claim 1, wherein the anode has a thickness of 65 nm to 100 nm.

7. The organic light emitting display device of claim 1, wherein the light emitting layer includes:
a first light emitting layer disposed on the anode,
a second light emitting layer disposed on the first light emitting layer, and
a third light emitting layer disposed on the second light emitting layer.

8. The organic light emitting display device of claim 7, further comprising:
a first hole transport layer disposed on the anode, the first light emitting layer disposed on the first hole transport layer;
a first charge generation layer disposed on the first light emitting layer;
a second hole transport layer disposed on the first charge generation layer, the second light emitting layer disposed on the second hole transport layer;
a second charge generation layer disposed on the second light emitting layer; and
a third hole transport layer disposed on the second charge generation layer, wherein the third light emitting layer is disposed on the third hole transport layer, and the cathode is disposed on the third light emitting layer.

9. The organic light emitting display device of claim 8, wherein the first hole transport layer has a thickness of 100 nm to 130 nm, the third hole transport layer has a thickness of 70 nm to 90 nm, and the anode has a thickness of 65 nm to 100 nm.

10. The organic light emitting display device of claim 9, wherein a thickness of the first hole transport layer is greater than a thickness of the third hole transport layer and a thickness of the anode, and the thickness of the anode is greater than or less than the thickness of the third hole transport layer.

11. An organic light emitting display device, comprising:
a substrate on which a plurality of sub-pixels are defined;
a thin film transistor disposed on the substrate;
a passivation layer disposed to cover the thin film transistor;
a color filter layer disposed on the passivation layer;
a planarization layer disposed on the color filter layer;
an anode disposed on the planarization layer and corresponding to each of the plurality of sub-pixels;
a bank defining an emission area by covering an edge of the anode;
at least one light emitting layer disposed on the anode; and
a cathode disposed on the light emitting layer,
wherein the anode includes indium oxide ($In_xO_y$) and molybdenum oxide ($MoO_z$), and
wherein the anode further includes a dopant including niobium oxide ($Nb_aO_b$).

12. An organic light emitting display device, comprising:
a substrate on which a plurality of sub-pixels are defined;
a thin film transistor disposed on the substrate;
a passivation layer disposed to cover the thin film transistor;
a color filter layer disposed on the passivation layer;
a planarization layer disposed on the color filter layer;
an anode disposed on the planarization layer and corresponding to each of the plurality of sub-pixels;
a bank defining an emission area by covering an edge of the anode;
at least one light emitting layer disposed on the anode; and
a cathode disposed on the light emitting layer,
wherein the anode includes indium oxide ($In_xO_y$) and molybdenum oxide ($MoO_z$), and
wherein the light emitting layer has a refractive index of 1.6 to 1.8, and the anode has a refractive index of 2.1 to 2.3.

13. The organic light emitting display device of claim 12, wherein the indium oxide ($In_xO_y$) includes indium (III) oxide ($In_2O_3$), and the molybdenum oxide ($MoO_z$) includes one of molybdenum trioxide ($MoO_3$) and molybdenum dioxide ($MoO_2$).

14. An organic light emitting display device, comprising:
a substrate on which a plurality of sub-pixels are defined;
a thin film transistor disposed on the substrate;
a passivation layer disposed to cover the thin film transistor;
a color filter layer disposed on the passivation layer;
a planarization layer disposed on the color filter layer;
an anode disposed on the planarization layer and corresponding to each of the plurality of sub-pixels;
a bank defining an emission area by covering an edge of the anode;
at least one light emitting layer disposed on the anode; and
a cathode disposed on the light emitting layer,
wherein the anode includes indium oxide ($In_xO_y$) and molybdenum oxide ($MoO_z$),
wherein the at least one light emitting layer comprises:
a first hole transport layer disposed on the anode;
a first light emitting layer disposed on the first hole transport layer;
a first charge generation layer disposed on the first light emitting layer;
a second hole transport layer disposed on the first charge generation layer;
a second light emitting layer disposed on the second hole transport layer;
a second charge generation layer disposed on the second light emitting layer;
a third hole transport layer disposed on the second charge generation layer;
a third light emitting layer disposed on the third hole transport layer; and
a cathode disposed on the third light emitting layer, and
wherein the first hole transport layer has a thickness of 100 nm to 130 nm, the third hole transport layer has a thickness of 70 nm to 90 nm, and the anode has a thickness of 65 nm to 100 nm.

15. The organic light emitting display device of claim 14, wherein a thickness of the first hole transport layer is greater than a thickness of the third hole transport layer and a thickness of the anode, and the thickness of the anode is greater than or less than the thickness of the third hole transport layer.

16. The organic light emitting display device of claim 14, wherein the indium oxide ($In_xO_y$) includes indium (III) oxide ($In_2O_3$), and the molybdenum oxide ($MoO_z$) includes one of molybdenum trioxide ($MoO_3$) and molybdenum dioxide ($MoO_2$).

17. The organic light emitting display device of claim 14, wherein the anode further includes a dopant.

18. The organic light emitting display device of claim 17, wherein the dopant includes niobium oxide ($Nb_aO_b$).

19. The organic light emitting display device of claim 14, wherein the light emitting layer has a refractive index of 1.6 to 1.8, and the anode has a refractive index of 2.1 to 2.3.

20. The organic light emitting display device of claim 14, wherein the anode has a thickness of 65 nm to 100 nm.

\* \* \* \* \*